(12) United States Patent
Chen et al.

(10) Patent No.: US 11,722,134 B2
(45) Date of Patent: Aug. 8, 2023

(54) RADIO FREQUENCY COMMUNICATION SYSTEM AND RADIO FREQUENCY SWITCH THEREOF

(71) Applicant: Shanghai Pingsheng Micro Corp, Shanghai (CN)

(72) Inventors: Bijiang Chen, Shanghai (CN); Yang Wang, Shanghai (CN)

(73) Assignee: SHANGHAI PINGSHENG MICRO CORP, Shanghai (CN)

( * ) Notice: Subject to any disclaimer, the term of this patent is extended or adjusted under 35 U.S.C. 154(b) by 0 days.

(21) Appl. No.: 17/675,095

(22) Filed: Feb. 18, 2022

(65) Prior Publication Data
US 2022/0263506 A1    Aug. 18, 2022

(30) Foreign Application Priority Data
Feb. 18, 2021 (CN) .......................... 202110189820.X

(51) Int. Cl.
*H03K 17/687* (2006.01)
*H04B 1/00* (2006.01)
*H04B 1/44* (2006.01)

(52) U.S. Cl.
CPC ......... *H03K 17/6874* (2013.01); *H04B 1/006* (2013.01); *H04B 1/44* (2013.01)

(58) Field of Classification Search
CPC ...... H04B 1/005; H04B 1/0053; H04B 1/006; H04B 1/40; H04B 1/44; H04B 1/48; H03K 17/04; H03K 17/041; H03K 17/04106; H03K 17/06; H03K 17/063; H03K 17/10; H03K 17/102; H03K 17/12; H03K 17/122; H03K 17/687; H03K 17/6872; H03K 17/6874; H03K 17/693
See application file for complete search history.

(56) References Cited

U.S. PATENT DOCUMENTS

| | | | |
|---|---|---|---|
| 10,044,331 B2 * | 8/2018 | Hurwitz | H01L 29/1045 |
| 2018/0323757 A1 * | 11/2018 | Hurwitz | H01L 27/1203 |

* cited by examiner

*Primary Examiner* — Long Nguyen
(74) *Attorney, Agent, or Firm* — Westman, Champlin & Koehler, P.A.

(57) ABSTRACT

Disclosed is a radio frequency switch and its radio frequency communication system. The RF switch comprises: N switch transistors $Q_1 \sim Q_N$ connected in series, wherein a first conducting terminal of $Q_1$ serves as an output end, a second conducting terminal of $Q_N$ serves as an input end a switch transistor located closer to the output end has a higher or equal withstand voltage than that of a switch transistor located closer to the input end, or a switch transistor located closer to the output end has a lower or equal withstand voltage than that of a switch transistor located closer to the input end, and $Q_1$ and $Q_N$ has different withstand voltages. The withstand voltages of the switch transistors match the voltage division situation of the switch transistors affected by parasitic effect in the RF switch, thus the voltage withstand capability is basically not affected by parasitic effect.

16 Claims, 3 Drawing Sheets

RADIO FREQUENCY COMMUNICATION SYSTEM AND RADIO FREQUENCY SWITCH THEREOF

CROSS-REFERENCES TO RELATED APPLICATION

This application claims priority to Chinese Application No. 202110189820.X, filed on Feb. 18, 2021, entitled "RADIO FREQUENCY COMMUNICATION SYSTEM AND RADIO FREQUENCY SWITCH THEREOF", published as CN113054958A on Jun. 29, 2021, the content of which is incorporated herein by reference in its entirety.

FIELD OF THE DISCLOSURE

The present disclosure relates to a technical field of electronics, in particular, to a radio frequency switch and its radio frequency communication system.

DESCRIPTION OF THE RELATED ART

With the popularity of portable digital products, a proportion accounted by radio frequency (RF) chips is getting higher and higher in communication systems. Radio frequency switches are widely used in RF channel switching, impedance matching, antenna tuning, aperture tuning fields and the like. In different applications, a RF voltage that a switch is required to withstand varies from several volts to several hundred volts.

However, in high frequency environments, radio frequency switches are affected by parasitic effect, their terminals may perform characteristics of a parasitic capacitor, leading to a non-negligible increase on an equivalent capacitance of the parasitic capacitor, which will adversely affect the performance of the radio frequency switches.

SUMMARY OF THE DISCLOSURE

An objective of the present disclosure is to solve the above-mentioned problems existing in the prior art. The present disclosure provides a radio frequency switch and its radio frequency communication system.

A first aspect of the present disclosure provides a radio frequency switch, comprising: N switch transistors $Q_1 \sim Q_N$ connected in series, wherein a switch transistor $Q_i$ of the N switch transistors has a first conducting terminal connected to a second conducting terminal of a switch transistor $Q_{i-1}$, a second conducting terminal of the switch transistor $Q_i$ is connected to a first conducting terminal of a switch transistor $Q_{i+1}$, a first conducting terminal of the switch transistor $Q_1$ serves as an output end of the radio frequency switch, a second conducting terminal of the switch transistor $Q_N$ serves as an input end of the radio frequency switch, where N is an integer greater than 1, and i is an integer smaller than N. Among the N switch transistors, a switch transistor located closer to the output end has a higher or equal withstand voltage than that of a switch transistor located closer to the input end, or a switch transistor located closer to the output end has a lower or equal withstand voltage than that of a switch transistor located closer to the input end, and a withstand voltage of the switch transistor $Q_i$ is different from a withstand voltage of the switch transistor $Q_N$.

Preferably, the output end is connected to a radio frequency power ground, the input end is connected to a radio frequency power source, and the withstand voltage of the switch transistor $Q_1$ is lower than that of the switch transistor $Q_N$.

Preferably, the withstand voltage of each one of the N switch transistors is related to its own channel length and/or channel width.

Preferably, at least two of the N switch transistors have channel lengths different from each other.

Preferably, the channel length of the switch transistor $Q_1$ is shorter than the channel length of the switch transistor $Q_N$.

Preferably, the channel lengths of the switch transistors connected in series are progressively increased.

Preferably, the channel widths of the switch transistors connected in series are progressively increased.

Preferably, each switch transistor comprised by the radio frequency switch is a silicon-on-insulator MOS transistor.

Preferably, the radio frequency switch also comprises: a plurality of bias units connected to substrate terminals of the N switch transistors, respectively; and a plurality of control units connected to control terminals of the N switch transistors, respectively.

A second aspect of the present disclosure provides a radio frequency communication system, comprising the radio frequency switch described above.

According to the radio frequency switch provided by embodiments of the present disclosure, difference exists among the withstand voltages of the N switch transistors. The differentiation design on the withstand voltages of the switch transistors can match the voltage division situation of the switch transistors affected by parasitic effect in the radiao frequency switch, so that a maximum withstand voltage that the radio frequency switch can withstand is basically not affected by parasitic effect. In some preferable embodiments, the channel lengths of the switch transistors connected in series are progressively increased, so that the differentiation design on the withstand voltages of the switch transistors in the radio frequency switch may be achieved. In some preferable embodiments, the channel widths of the switch transistors connected in series can also be progressively increased.

Further, the channel length and/or the channel width of each switch transistor in the radio frequency switch provided according to the embodiments of the present disclosure are designed to match with an actual voltage division situation of the switch transistors, so that the total area of the radio frequency switch is basically unchanged, and the manufacturing cost of the RF communication system may not be increased.

Additionally, the present disclosure provides improvements which are made during a manufacturing stage of the radio frequency switch, and there's no need to design additional peripheral compensation circuits in the manufactured radio frequency switch, thus reducing design complexity and manufacturing cost of the radio frequency switch.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF EMBODIMENTS OF THE DISCLOSURE

Figure 1:
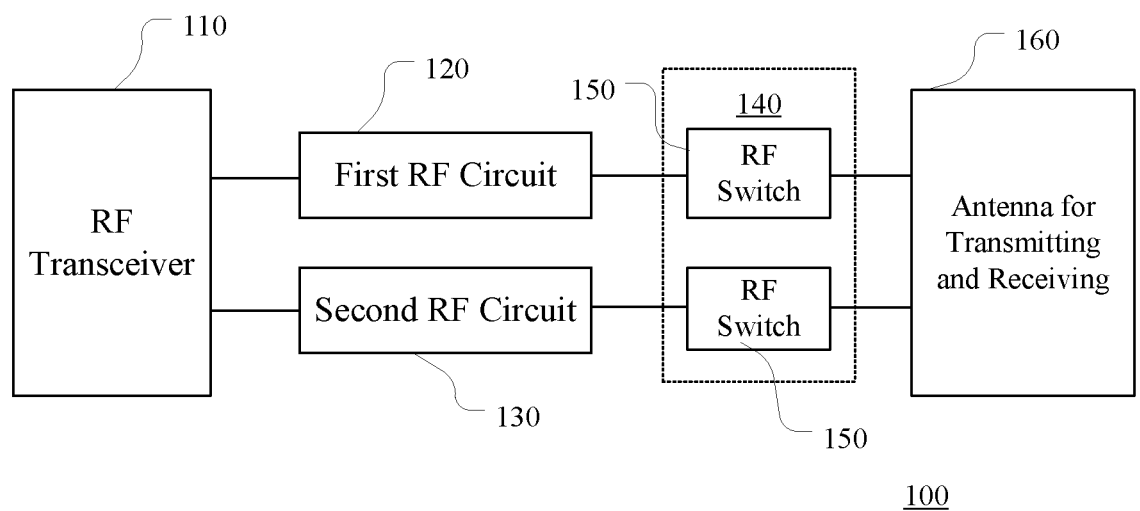
FIG. 1 shows a structural block diagram of a radio frequency communication system according to an embodiment of the present disclosure.

The present invention will be described in more detail below with reference to the accompanying drawings. Throughout the various figures, like elements are denoted by like reference numerals. For the sake of clarity, various parts in the drawings are not drawn to scale. In addition, some well-known parts may not be shown in the figures.

Hereinafter many specific details of the invention, such as a structure, material, a dimension, a processing process and a technique of a device, are described in order to make the invention clearly understood. However, as will be understood by those skilled in the art, the invention may be practiced without these specific details.

A radio frequency switch according to embodiments of the present disclosure can be applied to a radio frequency module in various communication systems, for achieving radio frequency channel switching, impedance matching, antenna tuning, aperture tuning and the like. A radio frequency switch is implemented, for example, by use of a transistor. A radio frequency switch according to embodiments of the present disclosure is illustrated by taking a silicon-on-insulator metal-oxide-semiconductor field effect transistor (SOI MOSFET) as an example, which has a semiconductor thin film formed on insulators and is also called bulk silicon MOS transistor. The SOI MOSFET has an insulating layer (such as an oxide layer) arranged between an active layer and a substrate to electrically isolating the active layer from the substrate, so that the parasitic capacitance of the SOI MOS transistor is about half of that of a traditional MOS transistor, and the response speed is fast, the power is low, and the integration level is high. Hereinafter, stacked transistor technology is taken as an example to implement the SOI MOS transistors in radio frequency switches.

There are various radio frequency communication systems comprising a radio frequency switch according to embodiments of the present disclosure, and a radio frequency channel switching system is described herein as an example.

FIG. 1 shows a structural block diagram of a radio frequency communication system according to an embodiment of the present disclosure.

As shown in FIG. 1, the radio frequency communication system 100 is, for example, a radio frequency channel switching system and may be applied in a receiving module of a terminal device. The radio frequency communication system 100 comprises a RF transceiver 110, at least two RF circuits (including a first RF circuit 120 and a second RF circuit 130), a selection circuit 140 and a antenna 160 for transmitting and receiving. The radio frequency communication system 100 may be used in a full duplex communication system or a half duplex communication system, wherein full duplex refers to an operating mode that both communication parties can transmit and receive messages at the same time, while half duplex refers to another operating mode that both communication parties can transmit and receive messages but cannot receive and transmit them at the same time.

The RF transceiver 110 comprises a receiver module, and a transmitter module for generating a first electromagnetic wave which can be transmitted in a channel, that is, the first electromagnetic wave is matched with characteristics of the selected channel configured to transmit the electromagnetic wave. For example, transformation, amplification, filtering, encoding and modulation functions may be realized in the transmitter module. The receiver module is used for obtaining an initial communication electric signal by amplifying, decoding and then demodulating a received second electromagnetic wave. Further, the transmitter module of the RF transceiver 110 may also comprise a multiplexer to achieve multiplexing, and correspondingly, the receiver module may achieve a function of demultiplexing for accurately demultiplexing a signal.

The first RF circuit 120 and the second RF circuit 130 are transmission media for establishing communication between the RF transceiver 110 and the antenna 160, and are configured to transmit electromagnetic waves. The first RF circuit 120 and the RF transceiver 110 are connected with each other to form an operating path for receiving and transmitting RF signals at a first frequency band, the second RF circuit 130 and the RF transceiver 110 are connected with each other to form an operating path for receiving and transmitting RF signals at a second frequency band, wherein the first frequency band and the second frequency band are, for example, two frequency sub-bands of a same frequency full-band. In order to receive and transmit electromagnetic waves corresponding to different frequency sub-bands of a same frequency full-band in different channels, different receiving ports and transmitting ports are set in the RF transceiver, to receive and transmitting electromagnetic waves.

The selection circuit 140 is configured to select one of the RF circuits which is required for establishing a communication connection between the RF transceiver 110 and the antenna 160. The selection circuit 140 comprises a control circuit (not shown) and at least two radio frequency switches 150, each of which is configured to connect a corresponding one of the RF circuits to the antenna 160. The control circuit is used to control the radio frequency switches to be on and off, and thereby select an appropriate one of the RF circuits to establish a corresponding channel connection between the RF transceiver 110 and the antenna 160.

In the radio frequency communication system 100, different frequency bands for communication are switched by turning the radio frequency switches 150 on or off. The radio frequency switches 150 provided according to the present disclosure can reduce the influence of parasitic effect on switching performances.

Figure 2:
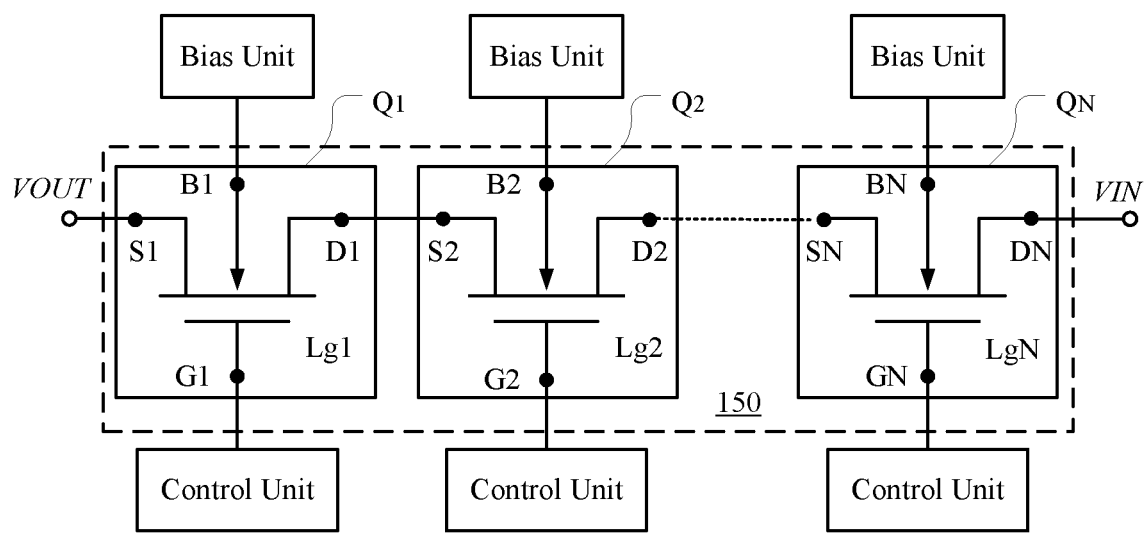
FIG. 2 shows a circuit diagram of a radio frequency switch according to an embodiment of the present disclosure.
Figure 3:
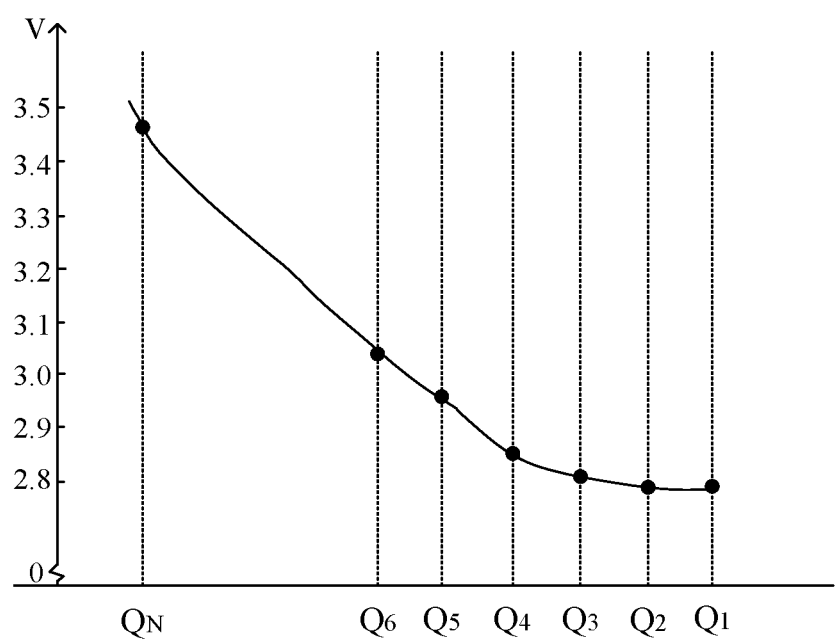
FIG. 3 shows a waveform diagram of a radio frequency switch according to an embodiment of the present disclosure.

FIG. 2 shows a circuit schematic diagram of a radio frequency switch according to an embodiment of the present disclosure, and FIG. 3 shows a waveform schematic diagram of the radio frequency switch according to an embodiment of the present disclosure.

As shown in FIG. 2, a radio frequency switch 150 comprises a plurality of switch transistors ($Q_1$-$Q_N$, where N is an integer greater than 1) connected in series, each of the plurality of switch transistors is realized by, for example, an SOI MOSFET and has a stacked structure. A first conducting terminal $S_i$ of the switch transistor $Q_i$ is connected to a second conducting terminal $D_{i-1}$ of the switch transistor $Q_{i-1}$, and a second conducting terminal $D_i$ of the switch transistor $Q_i$ is connected to a first conducting terminal $S_{i+1}$ of the switch transistor $Q_{i+1}$, where i is an integer greater than 1 and less than N. A first conducting terminal $S_1$ of the switch transistor $Q_1$ serves as an output end VOUT of the radio frequency switch 150, and a second conducting terminal $D_N$ of the switch transistor $Q_N$ serves as an input end VIN of the radio frequency switch 150. The input end VIN is connected, for example, to a RF power source or a terminal with a high-level voltage amplitude, and the output end VOUT is connected, for example, to a radio frequency power ground or a terminal with a low-level voltage amplitude. The control terminals G of the switch transistors are respectively connected to corresponding control units, and the substrate terminals B of the switch transistors are respectively connected to corresponding bias units.

The source-drain conducting paths of the serial connected switch transistors are connected in series to form a transmission path. If parasitic effect of the radio frequency switch is not considered, the withstand voltage of the entire radio frequency switch 150 may reach N*BVdss, if the source-drain withstand voltage of each switch transistor is BVdss. That is, the highest voltage that the radio frequency switch 150 can withstand under off state is N*BVdss. When the radio frequency switch 150 operates in a RF environment, the influence of parasitic effect on the radio frequency switch can not be ignored, at this time, an actual withstand voltage, which is an equivalent withstand voltage affected by parasitic effect, of each switch transistor changes under the influence of parasitic capacitor, the switch transistors included in the radio frequency switch no longer have a same voltage division capability due to parasitic effect, specifically, the voltage division capability of the switch transistor close to the input end VIN of the radio frequency switch 150 is improved, while the voltage division capability of the switch transistor close to the output end VOUT of the radio frequency switch 150 is reduced. That is, the highest voltage that the radio frequency switch 150 can withstand under off state is V1+V2+ . . . +VN, V1<V2< . . . <VN, where V1 is an equivalent source-drain voltage of switch transistor $Q_1$ affected by parasitic effect, V2 is an equivalent source-drain voltage of switch transistor $Q_2$ affected by parasitic effect, and VN is an equivalent source-drain voltage of switch transistor $Q_N$ affected by parasitic effect. That is to say, when the withstand voltage of each switch transistor is at limit state, VN=BVdss, the highest voltage that the radio frequency switch 150 can withstand under parasitic effect is far less than N*BVdss. In order to reduce the influence of parasitic effect on the withstand voltage of radio frequency switch 150, the source-drain withstand voltages of the MOS transistors connected in series in the radio frequency switch 150 are set differently, and the withstand voltage of each MOS transistor is set according to the influence of parasitic effect on the voltage division abilities of the MOS transistors in the radio frequency switch. Thus, under the influence of parasitic effect, the radio frequency switch 150 can withstand a same withstand voltage as a withstand voltage that is not affected by parasitic effect.

Further, the switch transistors included in the radio frequency switch 150 are manufactured to have different channel lengths, thereby differently setting the source-drain withstand voltages of the MOS transistors connected in series in the radio frequency switch 150. Specifically, the channel lengths of the switch transistors which are connected between the radio frequency ground and the radio frequency power source in series may satisfy the following relationship: Lg1≤Lg2≤ . . . ≤LgN, and Lg1<LgN, where Lg1 is the channel length of the switch transistor $Q_1$, Lg2 is the channel length of the switch transistor $Q_2$, and LgN is the channel length of the switch transistor $Q_N$. The shorter the channel length of a switch transistor, the smaller its withstand voltage; and the longer the channel length of a switch transistor, the larger its withstand voltage, thus basically eliminating parasitic effect.

Furthermore, the channel widths of the switch transistors can also be better designed, on a basis that the channel lengths of the switch transistors are changed. In particular, the channel widths of the switch transistors connected between the radio frequency ground and the radio frequency power source in series may satisfy the following relationship: Wg1≤Wg2≤ . . . ≤WgN, and Wg1<WgN, wherein, Wg1 is the channel width of the switch transistor $Q_1$, Wg2 is the channel width of the switch transistor $Q_2$, and WgN is the channel width of the switch transistor $Q_N$. The shorter the channel width of a switch transistor, the smaller its withstand voltage; and the longer the channel width of a switch transistor, the larger its withstand voltage, thus basically eliminating parasitic effect.

Further, the channel lengths of the switch transistors in the radio frequency switch 150 are designed based on an ideal channel length that is not affected by parasitic effect, and the channel length of some switch transistor may be reduced and the channel length of some switch transistor may be increased compared with the ideal channel length. The channel widths of the switch transistors in the radio frequency switch 150 are designed based on an ideal channel width which is not affected by parasitic effect, and the channel width of some switch transistor may be reduced and the channel width of some switch transistor may be increased compared with the ideal channel width. For the entire radio frequency switch 150, a total area for device integration basically remains unchanged, and the voltage withstand capability of the radio frequency switch 150 is basically not affected by parasitic effect in the RF environment. In other words, compared with a radio frequency switch composed of serial connected MOS transistors with a same withstand voltage, the total area of the radio frequency switch composed of serial connected MOS transistors with differentiated withstand voltages according to the embodiments of the present disclosure may be smaller, under a premise to satisfy design requirement on having a same withstand voltage of the radio frequency switch.

It should be noted that the first conducting terminal S of each MOS switch transistor is a source electrode and the second conducting terminal D is a drain electrode. Or, the first conducting terminal S of each MOS switch transistor is a drain electrode, and the second conducting terminal D is a source electrode.

As shown in FIG. 3, actual voltages generated by voltage division and applied to the switch transistors in the radio frequency switch 150 gradually increase, and target values of the source-drain withstand voltages of the MOS transistors in the radio frequency switch 150 also tend to increase, affected by the channel lengths.

According to the present disclosure, the MOS transistor in the radio frequency are not designed to have a same channel length, so that the switch transistors in the radio frequency switch may have different withstand voltages. Furthermore, the differentiation designed withstand voltages of the switch transistors can match the voltage division situation of the switch transistors affected by parasitic effect in the radio frequency switch, so that a maximum withstand voltage that the radio frequency switch can withstand is basically not affected by parasitic effect. The channel length and/or the channel width of each switch transistor in the radio frequency switch provided according to the embodiments of the present disclosure are designed to match with the actual voltage division situation of the switch transistors, so that the total area of the radio frequency switch is basically unchanged, and the manufacturing cost of the RF communication system may not be increased. And improvements provided according to embodiments of the present disclosure are made during the manufacturing stage of the radio frequency switch, and there's no need to design additional peripheral compensation circuits in the manufactured radio frequency switch, thus reducing design complexity and manufacturing cost of the radio frequency switch.

The radio frequency switch provided according to embodiments of the present disclosure can be applied to RF channel switching systems, and can also be applied to impedance matching, antenna tuning, aperture tuning circuits and the like.

Meanwhile, one of ordinary skill in the art can realize that the described functions may be implemented using different configuration methods or adjustment methods on each structure or reasonable variations of the structure in connection with the various exemplary structures and methods described in the embodiments disclosed herein, but such implementations should not be considered beyond the scope of the present invention. Furthermore, it should be understood that the connection relationship between the various components in the aforementioned drawings in the embodiments of the present disclosure is a just schematic example and does not impose any limitation on embodiments of the present disclosure.

It should be noted that relational terms such as first, second and the like are used herein only to distinguish one entity or operation from another and do not necessarily require or imply any such actual relationship or order between these entities or operations. Moreover, the terms "including", "comprising" or any other variation thereof are intended to encompass non-exclusive inclusion, so that a process, method, article or equipment that includes a set of elements not only includes those elements but may also includes other elements that are not explicitly listed or inherent elements of the process, method, article or equipment. In the absence of more restrictions, the statement "includes a . . . " for limiting an element does not preclude the existence of another identical element in the process, method, article or equipment that includes said element.

As described above, the embodiments in accordance with the present disclosure, are not exhaustively described in all details, and the invention is not limited to these specific embodiments which are described in the present disclosure. Obviously, according to the above description, many modifications and changes can be made. These embodiments are selected and specifically described in this specification in order to better explain the principles and practical applications of the invention, thereby enabling those skilled in the art to make good use of the invention and modifications based on the present disclosure. The invention is limited only by the claims and their full scope and equivalents.

What is claimed is:

1. A radio frequency switch, comprising:
N switch transistors $Q_1 \sim Q_N$ connected in series, among which a switch transistor $Q_i$ has a first conducting terminal connected to a second conducting terminal of a switch transistor $Q_{i-1}$, a second conducting terminal of the switch transistor $Q_i$ is connected to a first conducting terminal of a switch transistor $Q_{i+1}$, a first conducting terminal of the switch transistor $Q_1$ serves as an output end of the radio frequency switch, a second conducting terminal of the switch transistor $Q_N$ serves as an input end of the radio frequency switch, wherein N is an integer greater than 3, i is an integer smaller than N and larger than 1,
wherein for each two adjacent switch transistors of the N switch transistors, one of that two adjacent switch transistors which is located closer to the output end has a higher or equal withstand voltage than that of the other one of that two adjacent switch transistors which is located closer to the input end, or,
for each two adjacent switch transistors of the N switch transistors, one of that two adjacent switch transistors which is located closer to the output end has a lower or equal withstand voltage than that of the other one of that two adjacent switch transistors which is located closer to the input end, or,
wherein a withstand voltage of the switch transistor $Q_1$ is different from a withstand voltage of the switch transistor $Q_N$,
wherein the withstand voltage of each one of the N switch transistors is related to its own channel length and/or channel width.

2. The radio frequency switch according to claim 1, wherein the withstand voltage of the switch transistor $Q_1$ is lower than that of the switch transistor $Q_N$.

3. The radio frequency switch according to claim 1, wherein at least two of the N switch transistors have channel lengths different from each other.

4. The radio frequency switch according to claim 3, wherein the channel length of the switch transistor $Q_1$ is shorter than the channel length of the switch transistor $Q_N$.

5. The radio frequency switch according to claim 4, wherein the channel lengths of the switch transistors connected in series are progressively increased.

6. The radio frequency switch according to claim 5, wherein the channel widths of the switch transistors connected in series are progressively increased.

7. The radio frequency switch according to claim 1, wherein each switch transistor comprised by the radio frequency switch is a silicon-on-insulator MOS transistor.

8. The radio frequency switch according to claim 1, further comprising:
a plurality of bias units respectively connected to substrate terminals of the N switch transistors; and
a plurality of control units respectively connected to control terminals of the N switch transistors.

9. A radio frequency communication system, comprising the radio frequency switch according to claim 1.

10. The radio frequency communication system according to claim 9, wherein the withstand voltage of the switch transistor $Q_1$ is lower than that of the switch transistor $Q_N$.

11. The radio frequency communication system according to claim 9, wherein at least two of the N switch transistors have channel lengths different from each other.

12. The radio frequency communication system according to claim 11, wherein the channel length of the switch transistor $Q_1$ is shorter than the channel length of the switch transistor $Q_N$.

13. The radio frequency communication system according to claim 12, wherein the channel lengths of the switch transistors connected in series are progressively increased.

14. The radio frequency communication system according to claim 13, wherein the channel widths of the switch transistors connected in series are progressively increased.

15. The radio frequency communication system according to claim 9, wherein each switch transistor comprised by the radio frequency switch is a silicon-on-insulator MOS transistor.

16. The radio frequency communication system according to claim 9, wherein the radio frequency switch further comprises:
a plurality of bias units respectively connected to substrate terminals of the N switch transistors; and a plurality of control units respectively connected to control terminals of the N switch transistors.

* * * * *